(12) United States Patent
Moon et al.

(10) Patent No.: US 7,189,981 B2
(45) Date of Patent: Mar. 13, 2007

(54) ELECTROMAGNETIC FOCUSING METHOD FOR ELECTRON-BEAM LITHOGRAPHY SYSTEM

(75) Inventors: Chang-wook Moon, Seoul (KR);
Sidorkin Vadim, Gyeonggi-do (KR);
Chang-hoon Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 11/205,148

(22) Filed: Aug. 17, 2005

(65) Prior Publication Data

US 2006/0151720 A1 Jul. 13, 2006

(30) Foreign Application Priority Data

Dec. 20, 2004 (KR) .................. 10-2004-0108820

(51) Int. Cl.
*H01J 37/302* (2006.01)
*H01J 1/30* (2006.01)

(52) U.S. Cl. ............... 250/492.22; 250/492.2; 250/492.23; 250/492.3; 250/310; 250/396 R; 250/396 ML (58) Field of Classification Search .......... 250/492.22, 250/492.2
See application file for complete search history.

(56) References Cited

U.S. PATENT DOCUMENTS

| 5,051,556 | A * | 9/1991 | Sakamoto et al. | 219/121.25 |
|---|---|---|---|---|
| 5,173,582 | A * | 12/1992 | Sakamoto et al. | 219/121.25 |
| 5,583,336 | A * | 12/1996 | Kelly | 250/305 |
| 6,222,197 | B1 * | 4/2001 | Kojima | 250/492.22 |
| 2005/0184256 | A1 * | 8/2005 | Chauhan et al. | 250/492.22 |
| 2006/0056596 | A1 * | 3/2006 | Mori et al. | 378/138 |
| 2006/0060781 | A1 * | 3/2006 | Watanabe et al. | 250/310 |
| 2006/0151712 | A1 * | 7/2006 | Moon et al. | 250/396 ML |
| 2006/0151720 | A1 * | 7/2006 | Moon et al. | 250/492.22 |

* cited by examiner

*Primary Examiner*—Nikita Wells
*Assistant Examiner*—Bernard Souw
(74) *Attorney, Agent, or Firm*—Buchanan Ingersoll & Rooney PC (57) ABSTRACT

A method for projecting a predetermined pattern of an electron beam from an emitter to a wafer in a vacuum chamber of an electron-beam lithography system is provided. An initial condition for performing an electromagnetic focusing is first set and outspread phenomenon of the electron beam, which is caused by an initial emitting velocity difference and an initial emitting angle difference between electrons emitted from the emitter, is corrected. Then, a shift of the electron beam, which is caused when an electric field is not in parallel with a magnetic field, is corrected and a shift of the electron beam, which is caused by a gradient of the magnetic field, is corrected, after which an increase of a beam diameter of the electron beam, which is caused by Coulomb-interaction between the electrons emitted from the emitter, is corrected. Then, it is determined if a focusing error is within a range of an allowable error. When it is determined the focusing error is out of the range of the allowable error, the above operations are repeated.

13 Claims, 5 Drawing Sheets

ELECTROMAGNETIC FOCUSING METHOD FOR ELECTRON-BEAM LITHOGRAPHY SYSTEM

CROSS-REFERENCE TO RELATED PATENT APPLICATION

This application claims the benefit of Korean Patent Application No. 10-2004-0108820, filed on Dec. 20, 2004, in the Korean Intellectual Property Office, the disclosure of which is incorporated herein in its entirety by reference.

BACKGROUND OF THE INVENTION

1. Field of the Invention

The present invention relates to an electromagnetic focusing method for an electron-beam lithography system, and more particularly, to an electromagnetic focusing method, which can accurately focus the electron beam even when (a) the electric and magnetic fields are not in parallel with each other in a vacuum chamber of an electron-beam lithography system, (b) intensity of magnetic field is not uniform, and (c) there is Coulomb-interaction between electrons.

2. Description of the Related Art

In a semiconductor manufacturing process, a variety of lithography technologies have been used to process a surface of a wafer in a predetermined pattern. Among the technologies, an optical lithography has been widely used. However, there is a limitation in reducing a line width using the optical lithography. Accordingly, in recent years, a next generation lithography (NGL) technology that makes it possible to realize a semiconductor having an integrated circuit with a nano-scale line width has been developed. An electron-beam lithography, an ion-beam lithography, an extreme ultraviolet lithography, a proximity X-ray lithography are well known as such NGL technologies.

Among the technologies, the electron-beam lithography system is designed to use electron beam in order to develop an electron-resist deposited on a wafer in a predetermined pattern. The electron-beam lithography system has advantages of being formed in a simple structure and easily realizing a large-sized electron beam emitter, thereby quickly forming a complicated pattern at a time.

Figure 1:
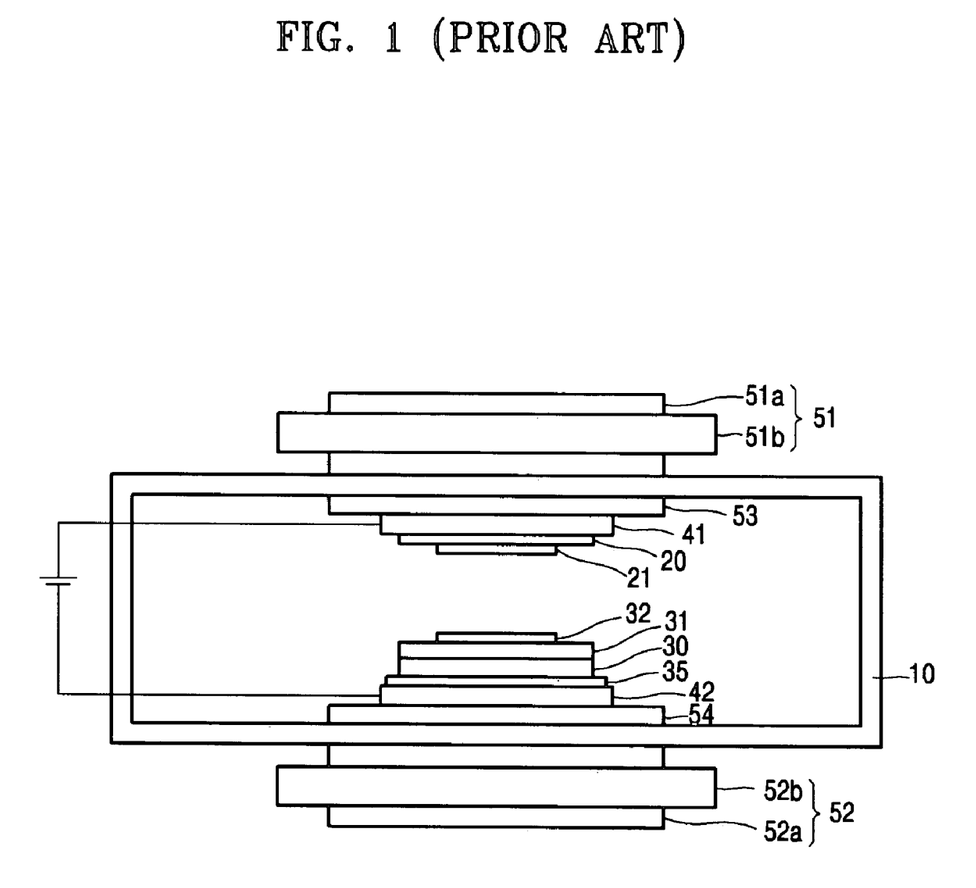
FIG. 1 is a sectional view of a conventional electron-beam lithography system.

FIG. 1 schematically shows a conventional electron-beam lithography system.

As shown in FIG. 1, an electron-beam lithography system includes a vacuum chamber 10 defining a wafer processing space. The vacuum chamber 10 is vacuumized by a vacuum pump. An electron-beam emitter 20 for emitting electron beam is installed in the vacuum chamber 10. The wafer 30 is disposed facing the electron-beam emitter 20 and spaced away from the electron-beam emitter 20 by a predetermined distance. A mask 21 formed in a predetermined pattern is disposed on an emitting surface of the electron-beam emitter 20 so that electron beam can be emitted through a portion that is not covered by the mask 21. As a result, an electron resist deposited on the wafer 30 is patterned by the electron beam in a pattern identical to that formed on the emitting surface of the emitter 20. The wafer 30 is supported by a wafer holder 35 disposed in the vacuum chamber 10.

Upper and lower magnet assemblies 51 and 52 are respectively installed on top and bottom of the vacuum chamber 10 to form a magnetic field in the vacuum chamber 10. The upper magnet assembly 51 includes a core 51a formed of a ferromagnetic substance and a coil 51b wound around the cores 51a. The lower magnet assembly 52 includes a core 52a formed of the ferromagnetic substance and a coil 52b wound around the core 52a. Upper and lower pole-pieces 53 and 54 are installed penetrating the top and bottom of the vacuum chamber 10, respectively. The upper and lower pole-pieces 53 and 54 magnetically contact the cores 51a and 52a of the respective upper and lower magnet assemblies 51 and 52, respectively. The upper and lower pole-pieces 53 and 54 function to introduce magnetic flux generated by the upper and lower magnet assemblies 51 and 52 into the vacuum chamber 10.

Provided in the vacuum chamber 10 are electrode plates 41 and 42 forming an electric field between the emitter 20 and the wafer 30. The electrode plates 41 and 42 are disposed on respective rear surfaces of the emitter and wafer 20 and 30 and connected to a power supply. The electron beam emitted from the emitter 20 are directed onto the electron resist 31 formed on the wafer 30 by mutual reaction between the electric and magnetic fields respectively formed by the magnet assemblies 51 and 52 and the electrode plates 41 and 42.

In order to accurately direct the electron beam emitted from the emitter 20 onto the electron resist 31, components of the electron-beam lithography system should be precisely aligned to uniformly maintain the electric and magnetic fields. However, it is inevitable there is some alignment error during the manufacturing and assembly process of the system. However, when the alignment error of the components is too big, the electric field may not be in parallel with the magnetic field or the intensity of the magnetic field may be increased or decreased according to the distance between the emitter and the wafer. As a result, the electron beam may not be accurately landed on the target location. In addition, when the electron beam is emitted from the large-sized surface, the repulsive force between electrons according to Coulombs law may increase the beam diameter. In this case, an error caused by the assembly tolerance should be compensated by properly adjusting the intensity of the electromagnetic field. However, no accurate standard for adjusting the intensity of the electromagnetic field is provided, it is difficult and time-consuming to accurately focus the electron beam.

SUMMARY OF THE INVENTION

The present invention provides an electromagnetic focusing method, which can accurately focus the electron beam even when (a) the electric and magnetic fields are not in parallel with each other in a vacuum chamber of an electron-beam lithography system, (b) intensity of magnetic field is not uniform, and (c) there is Coulomb-interaction between electrons.

According to an aspect of the present invention, there is provided a method for projecting a predetermined pattern of an electron beam from an emitter to a wafer in a vacuum chamber of an electron-beam lithography system, the method comprising setting an initial condition for performing an electromagnetic focusing; correcting outspread phenomenon of the electron beam, which is caused by an initial emitting velocity difference and an initial emitting angle difference between electrons emitted from the emitter; correcting a shift of the electron beam, which is caused when an electric field is not in parallel with a magnetic field; correcting a shift of the electron beam, which is caused by a gradient of the magnetic field; correcting an increase of a beam diameter of the electron beam, which is caused by Coulomb-interaction between the electrons emitted from the emitter; and determining if a focusing error is within a range of an allowable error and repeating, when it is determined the focusing error is out of the range of the allowable error, the above operations. At this point, the allowable error range may be less than 10% of a line width of a pattern, which is to be formed on the wafer.

The setting an initial condition can be realized by setting parameters in the vacuum chamber such that the electrons emitted from the emitter reach the wafer by one time-spiral rotation. The parameters in the vacuum chamber satisfy the following equation:

$$V = \frac{qd^2B^2}{2\pi^2 m}\left(1 + \frac{\pi^2 r^2}{d^2}\right)$$

$$v_{*1} = r\omega$$

where, V is an acceleration voltage applied to an electrode plate disposed in the vacuum chamber, q is a quantity of an electric charge, d is a distance between the emitter and the wafer, B is an intensity of the magnetic field, r is a rotational radius of the electron rotating in a spiral motion, and m is a mass of the electron. The setting an initial condition is realized in a state where it is assumed that the electric and magnetic fields are in parallel with each other, no gradient of the magnetic field is incurred, and no Coulomb-interaction between the electrons in the electron beam exists.

When $R_{cd}$ is a radius of an area within which the electrons emitted from the identical location in the emitter are projected on the wafer, c is the speed of light, e is a quantity of electric charge, Vo is an initial velocity of the electron, $\alpha$ is an emission angle of the electron, V is an acceleration voltage, m is a mass of the electron, B is an intensity of the magnetic field, and d is a distance between the emitter and the wafer, a condition for minimizing the $R_{cd}$ is calculated from the following equation in the operation of the correcting outspread phenomenon:

$$R_{cd} = 2c\frac{\sqrt{2eV_0 m}}{eB}\sin\alpha\sin\left\{\frac{eBd}{\sqrt{2eVm}}\left[1 - \sqrt{\frac{V_0}{V}}\cos\alpha\right]\right\}$$

wherein, it is assumed that the electric and magnetic fields are in parallel with each other, no gradient of the magnetic field is incurred, and no Coulomb-interaction between the electrons in the electron beam exists. At this point, The $R_{cd}$ is adjusted to be different from a line width of a pattern, which is to be formed on the wafer, by less than 10%.

When $\beta$ indicates an angle between electric and magnetic fields, $\Delta$ is a shift distance of the electron beam, d is a distance between the wafer and the emitter, R is a rotational radius of the electron rotating in a spiral motion, e is a quantity of electric charge, B is an intensity of the magnetic field, c is the speed of light, V is an acceleration voltage, and m is a mass of the electron, a condition for minimizing the shift distance $\Delta$ is calculated from the following equations in the operation of the correcting a shift of the electron beam:

$$\Delta = d\sin\beta \text{ and } R = \frac{c}{eB}\sqrt{2demV}\sin\beta$$

At this point, the shift distance $\Delta$ is adjusted to be less than 10% of a line width of a pattern, which is to be formed on the wafer.

The shift distance of the electron beam, which is caused by the gradient of the magnetic field, can be calculated from the following equation:

$$\Delta R_2 = \frac{mv_{0\perp}^2 c}{eB_0^2}\sqrt{\frac{m}{2eV}}\,d\frac{\partial B}{\partial x}$$

where, $\Delta R_2$ is a shift distance of the image when the electron beam reaches the wafer, $V_o^\perp$ is an initial velocity of a component perpendicular to the moving path of the electron, Bo is an intensity of the initial magnetic field at the location of the emitter, d is a distance between the wafer and the emitter, e is a quantity of electric charge, B is an intensity of the magnetic field, c is the speed of light, V is an acceleration voltage, and m is a mass of the electron; and the shift distance of the electron beam can be minimized by calculating a condition for minimizing the $\Delta R_2$ and applying the calculated condition. At this point, the shift distance $\Delta R_2$ is adjusted to be less than 10% of a line width of a pattern, which is to be formed on the wafer.

The increased value of the beam diameter can be calculated form the following equation:

$$\Delta R_1 \frac{\sqrt{2}\,I}{R_1 V}\sqrt{\frac{m}{eV}}\,d^2$$

where, $\Delta R_1$ indicates the increased value of the beam diameter by the Coulomb-interaction, $R_1$ is a beam diameter of an initial electron beam, I represents emission current of the emitter, d is a distance between the wafer and the emitter, e is a quantity of electric charge, V is an acceleration voltage, and m is a mass of the electron; and the increase of the beam diameter, which is caused by the Coulomb-interaction, can be minimized by calculating a condition for minimizing the increase of the beam diameter form the equation and applying the condition. At this point, the increased value $\Delta R_1$ is adjusted to be less than 10% of a line width of a pattern, which is to be formed on the wafer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 2:
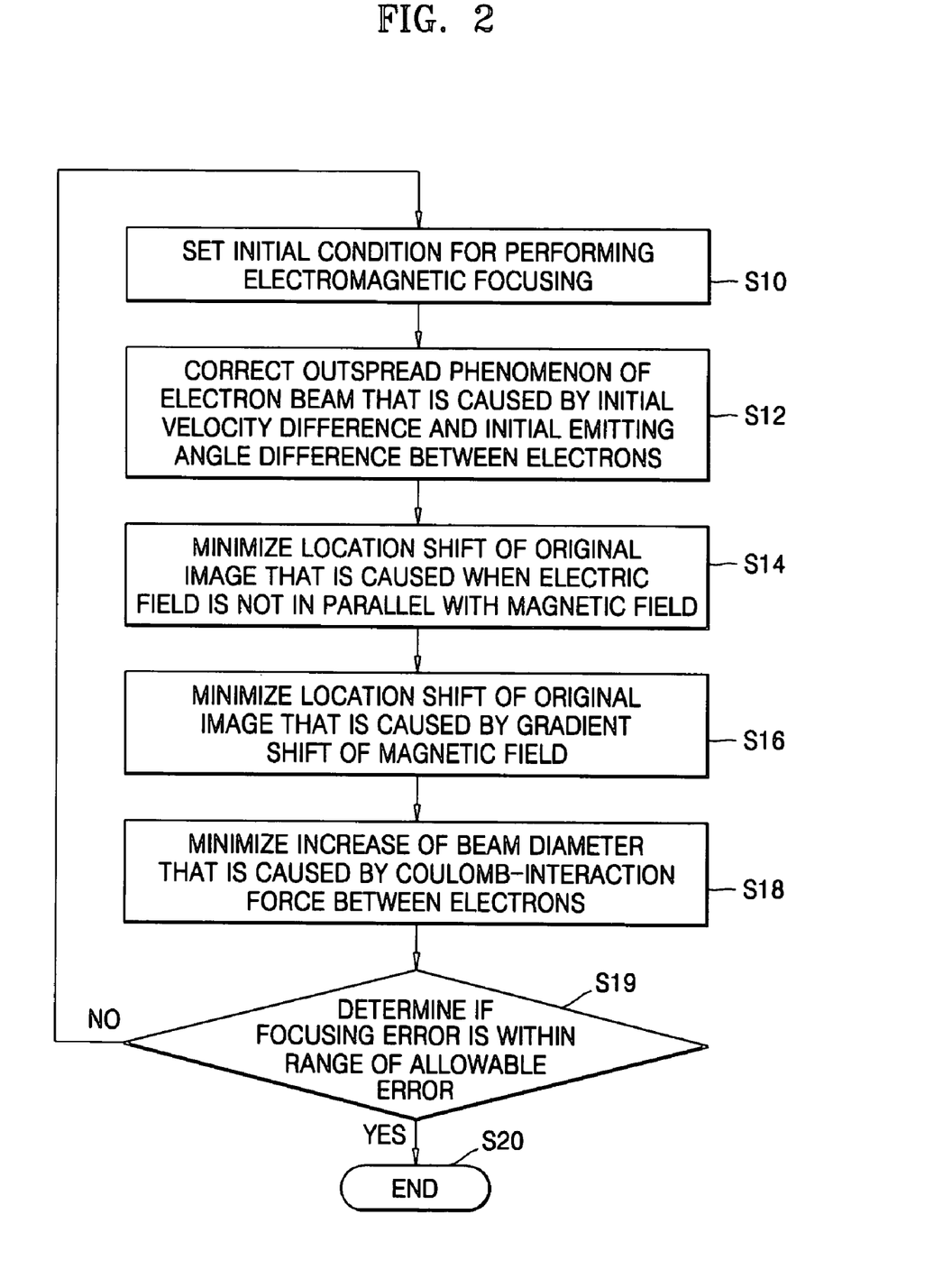
FIG. 2 is a flow chart illustrating a method for focusing electron beams according to an embodiment of the present invention.

FIG. 2 is a flow chart illustrating a method for performing an electromagnetic focusing according to an embodiment of the present invention.

As shown in FIG. 2, an initial condition for performing the electromagnetic focusing is set (S10). That is, before a focusing error caused by a variety of reasons is corrected, a variety of parameters for controlling an image formed on a wafer by an electron beam are set as predetermined reference values. An intensity of a magnetic field in the vacuum chamber, an initial velocity and emitting angle of an electron, a gradient of a magnetic field, a distance between the wafer and emitter, and an acceleration voltage may be used as parameters for determining a path of the electron projected to the wafer in a perpendicular direction. It may be preferable that the intensity of the magnetic field, the acceleration voltage, and the distance between the wafer and emitter are used as the predetermined reference values as it is easy to directly control them.

Figure 3:
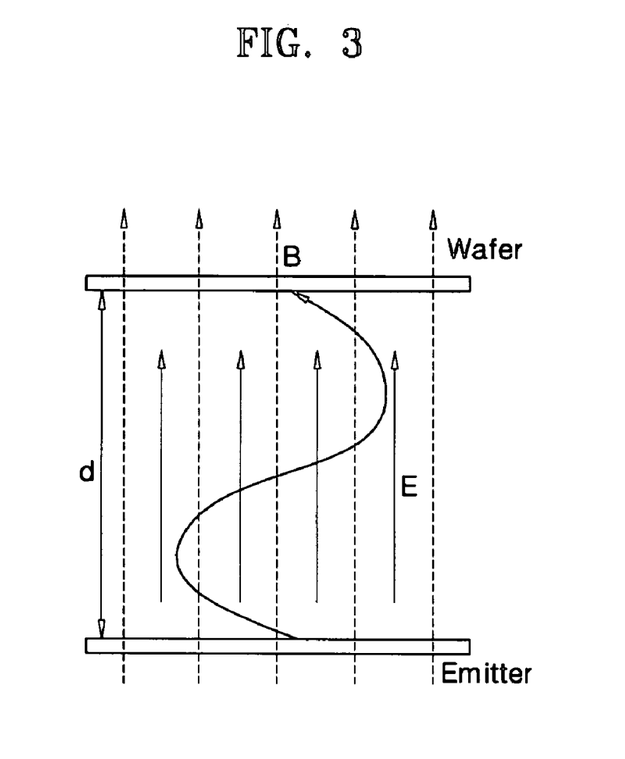
FIG. 3 is a schematic view illustrating a spiral-moving path of electrons emitted from a wafer.

In the present invention, the values such as the intensities of the electric and magnetic fields between the emitter and the wafer and the distance between the emitter and the wafer are determined in order for the electron emitted from the emitter to reach the wafer by only one time spiral-rotation. In FIG. 3, an arrow represented as a sine-wave curve indicates a movement path of the electron emitted from the emitter. Although the movement path is indicated by the sine-wave curve in FIG. 3 due to the representing limitation in the two-dimension, the actual movement path should be represented in a spiral curve in the three-dimensional motion. That is, the electron is directed while moving in a spiral motion.

A relations between the parameters determined in order for the electron emitted from the emitter to reach the wafer by only one time spiral-rotation can be represented by the following equation (1):

$$V = \frac{qd^2B^2}{2\pi^2 m}\left(1 + \frac{\pi^2 r^2}{d^2}\right) \quad \text{Equation 1}$$

$$v_{*1} = r\omega$$

where, V is an acceleration voltage applied to an electrode plate disposed in the vacuum chamber, q is a quantity of an electric charge, d is a distance between the emitter and the wafer, B is an intensity of a magnetic field, r is a rotational radius of the electron rotating in the spiral motion, and m is a mass of the electron. The rotational radius can be calculated using an initial velocity and angular velocity of the electron component parallel with the emitter.

The actual values of the parameters may be varied in accordance with a specification of an actual electron-beam lithography system. At this point, in the course of initialising the parameter values, the factors causing the focusing error are not considered. That is, it is assumed that the electric and magnetic fields are in parallel with each other, no gradient of the magnetic field is incurred, and no Coulomb-interaction between the electrons in the electron beam exists.

Next, an outspread phenomenon that is incurred on the wafer due to the difference of the initial velocity difference and emission angle difference between the electrons emitted from the emitter is corrected (S12). Generally, since the electrons in the emitter are not in an identical state, the electrons emitted on an identical location in the emitter have a different initial velocity and a different emission angle from each other. Therefore, not all of the electrons emitted from the identical location are directed to an identical location on the wafer. The electrons are directed to slightly different locations within a predetermined radius. The outspread radius of the electrons can be represented by the following equation (2):

$$R_{cd} = 2c\frac{\sqrt{2eV_0 m}}{eB}\sin\alpha\sin\left\{\frac{eBd}{\sqrt{2eVm}}\left[1 - \sqrt{\frac{V_0}{V}}\cos\alpha\right]\right\} \quad \text{Equation 2}$$

where, $R_{cd}$ is a radius of an area within which the electrons emitted from the identical location in the emitter are projected on the wafer, c is the speed of light, e is a quantity of electric charge, Vo is an initial velocity of the electron, and $\Delta$ is an emission angle of the electron.

As can be noted from the equation (2), by set the $R_{cd}$ as small as possible, the outspread phenomenon of the electron beam can be corrected. To achieve this, since the affection of the initial velocity V0 and the emission angle $\alpha$ should be reduced as small as possible, the distance d between the emitter and the wafer is reduced while the intensity of the magnetic field B and the acceleration voltage V are increased until the $R_{cd}$ is reduced to be lower than a predetermined value. Particularly, from the equation (2), it can be noted that the intensity of the magnetic filed B affects a lot the value of the $R_{cd}$. Although it is preferable that the $R_{cd}$ is adjusted as small as possible, it is generally adjusted to be different from a line width of a pattern, which is to be formed on the wafer, by less than 10%. In this case, as in the course of initialising the parameter values, the factors causing the focusing error are not considered.

Figure 4:
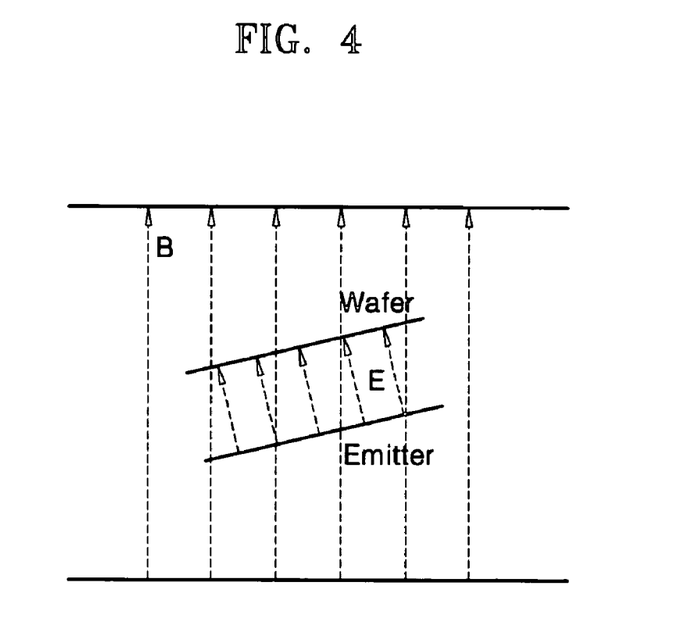
FIG. 4 is a view illustrating a state where electric and magnetic fields are not in parallel with each other in a vacuum chamber.

After the above, the focusing error caused when the electric and magnetic fields are not in parallel with each other is corrected (S16). In the electron-beam lithography system, the wafer and emitter disposed in the vacuum chamber should be arranged to be in parallel with upper and lower pole-pieces. However, due to the assembly tolerance, the wafer and emitter holders are minutely misaligned. As a result, as shown in FIG. 4, the electric and magnetic fields E and B are minutely misaligned from each other. In this case, the electrons emitted from the emitter cannot be projected on the desired location of the wafer in a perpendicular direction but reaches the wafer after being shifted along the magnetic field by a predetermined distance.

Figure 5:
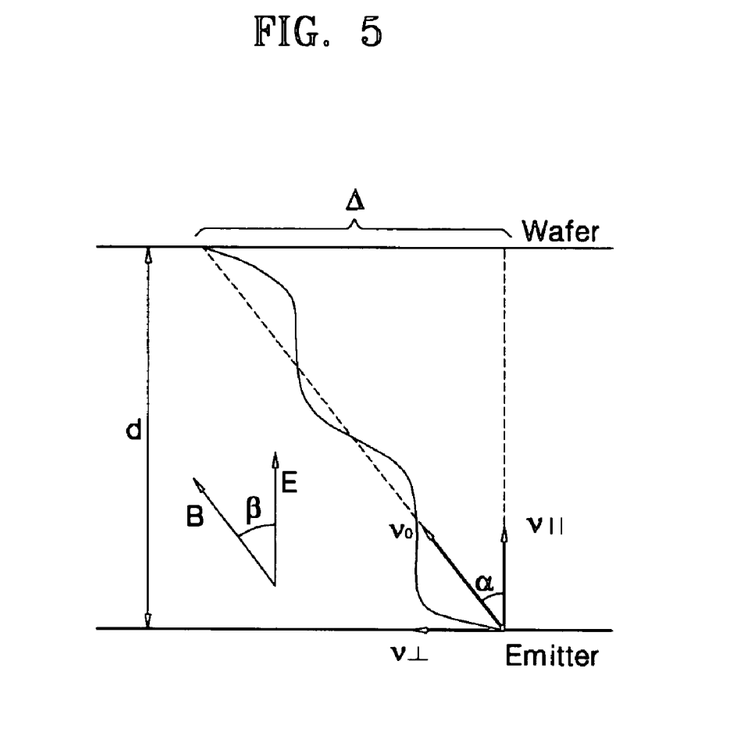
FIG. 5 is a schematic view illustrating a relation between a location shift distance of an original image and an angle between electric and magnetic fields when the electric and magnetic fields are not in parallel with each other.

FIG. 5 is a schematic view illustrating a relation between a location shift distance of an original image and an angle between the electric and magnetic fields when the electric and magnetic fields are not in parallel with each other. In FIG. 5, $\alpha$ indicates an emission angle just at a moment the electron is emitted from the emitter, β indicates an angle between the electric field and the magnetic field, Δ is a shift distance of the original image, and d is a distance between the wafer and the emitter. Although the electron is initially emitted at an angle α, since it moves along the magnetic field in the course of being directed toward the wafer, it reaches the wafer at an angle β. As a result, the following equation (3) can be established:

$$\Delta = d \sin \beta \qquad \text{Equation 3}$$

When the shift distance of the original image projected from the emitter to the wafer is calculated from the equation (3), the shifted angle between the electric field and the magnetic field can be identified. When it is determined from the identification that the electric filed is not in parallel with the magnetic field, the affection of this should be minimized by adjusting the intensity of the magnetic field, the distance between the wafer and the emitter, the acceleration voltage, and the like. The relation between them can be calculated from the following equation (4):

$$R = \frac{c}{eB} \sqrt{2demV} \sin\beta \qquad \text{Equation 4}$$

where, R is a rotational radius of the electron rotating along a spiral path, e is a quantity of the electric charge, B is an intensity of the magnetic field, c is the velocity of light, d is a distance between the wafer and the emitter, m is a mass of the electron, V is an acceleration voltage, and β is an angle between the electric and magnetic fields.

From the equations (3) and (4), a relation between the parameters for minimizing the shift distance Δ of the original image can be calculated. For example, a proper intensity of the magnetic filed, a proper distance between the wafer and the emitter, and a proper value of the acceleration voltage can be calculated from the equations (3) and (4) in order for the shift distance Δ of the original image can be less than 10 % of a line width of a pattern, which is to be formed on the wafer.

Figure 6A:
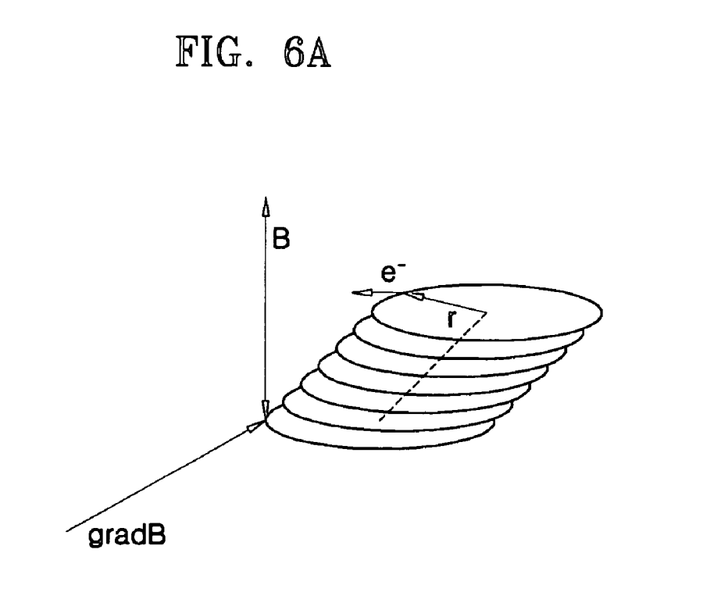
FIGS. 6a and 6b are views illustrating the movement of the electrons when there is a gradient of magnetic field.
Figure 6B:
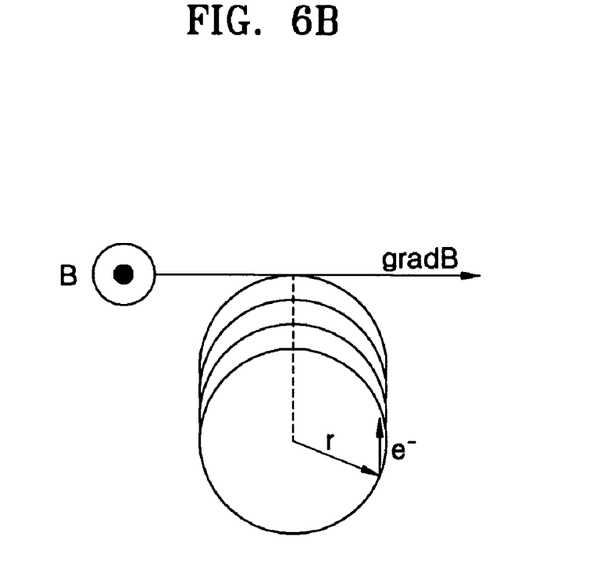

When there is still an image shift phenomenon even after the focusing error caused when the electric field is not in parallel with the magnetic field is corrected, it can be assumed that there is a gradient of the magnetic field. FIGS. 6a and 6b illustrate the movement of the electrons when there is a gradient of magnetic field. As shown in FIGS. 6a and 6b, when the intensity of the magnetic field in the vacuum chamber is varied little by little, the electron is advanced along the magnetic field, in the course of which, the electron is gradually shifted in a direction perpendicular to a gradient direction (i.e., a direction of the grad B vector) of the magnetic field. As a result, when the electron beam reaches the wafer, the landing location of the electron beam on the wafer is shifted from the target location on the wafer by a predetermined distance. The shift distance of the image, which is caused by the gradient of the magnetic field, can be calculated from the following equation (5):

$$\Delta R_2 = \frac{mv_{0\perp}^2 c}{eB_0^2} \sqrt{\frac{m}{2eV}} d \frac{\partial B}{\partial x} \qquad \text{Equation 5}$$

where, $\Delta R_2$ is a shift distance of the image when the electron beam reaches the wafer, $V_{o\square}$ is an initial velocity of a component perpendicular to the moving path of the electron, and Bo is an intensity of the initial magnetic field at the location of the emitter. From the equation (5), a condition for minimizing the $\Delta R_2$ can be obtained. By applying the condition, the electron beam shift, which may be caused by the gradient of the magnetic field, can be minimized (S16). In this case, it is preferable that the shift distance $\Delta R_2$ of the image, which is caused by the gradient of the magnetic field, is less than 10% of the line width of the pattern, which is to be formed on the wafer.

Figure 7:
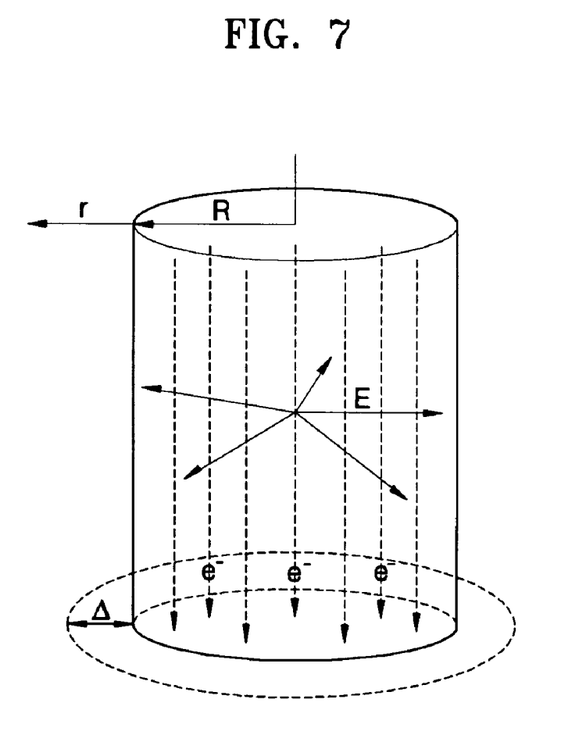
FIG. 7 is a view illustrating a phenomenon where a beam diameter of an electron beam emitted from an emitter is enlarged.

Meanwhile, when the electron beam is emitted from the large area, the beam diameter is increased by the Coulomb-interaction generating the force of repulsion between the electrons. FIG. 7 illustrates a phenomenon where a beam diameter of an electron beam emitted from an emitter is enlarged.

As shown in FIG. 7, when the electron beam is emitted from the emitter, the beam diameter is R, and when the electron beam reaches the wafer, the beam diameter becomes R+Δ by being increased by the Δ. The increase of the beam diameter can be obtained from the following equation (6):

$$\Delta R_1 \frac{\sqrt{2} I}{R_1 V} \sqrt{\frac{m}{eV}} d^2 \qquad \text{Equation 6}$$

where, $\Delta R_1$ indicates an increased value of the beam diameter by the Coulomb-interaction, $R_1$ is a beam diameter of an initial electron beam, and I represents emission current of the emitter.

When the image pattern on the wafer is greater than that on the original image pattern on the emitter in a state where no location shift is incurred by applying the values such as d (the distance between the emitter and the wafer), V (the acceleration voltage) and B (the intensity of the magnetic field) that are obtained through the above operations (S10 through S16), it can be assumed that large Coulomb-interaction is applied. In this case, from the equation (6), a condition for minimizing the increase of the beam diameter is calculated and applied (S18). It is also preferable that the increased value $\Delta R_1$ of the beam diameter is less than 10% of the line width of the pattern, which is to be formed on the wafer.

After the above, it is determined if the electron beam is focused such that the pattern formed on the wafer can be within a range of the maximum allowable error. For example, when the focusing error is less than 10% of the line width of the pattern, it is determined that the error is properly corrected and the correcting operation is finished (S20). However, when the pattern formed on the wafer is greater than the range of the maximum allowable error, the operations S10 through S18 are repeated until it is within the range of the maximum allowable error.

According to the present invention, the electron beam can be accurately focused even when (a) the electric and magnetic fields are not in parallel with each other in a vacuum chamber of an electron-beam lithography system, (b) intensity of magnetic field is not uniform, and (c) there is Coulomb-interaction between electron beams. Particularly, since a variety of conditions for accurately focusing the electron beam can be obtained from the equations (1) through (6), the beam focusing accuracy can be enhanced while the time for focusing the electron beam can be saved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for projecting a predetermined pattern of an electron beam from an emitter to a wafer in a vacuum chamber of an electron-beam lithography system, the method comprising:
   setting an initial condition for performing an electromagnetic focusing;
   correcting outspread phenomenon of the electron beam, which is caused by an initial emitting velocity difference and an initial emitting angle difference between electrons emitted from the emitter;
   correcting a shift of the electron beam, which is caused when an electric field is not in parallel with a magnetic field;
   correcting a shift of the electron beam, which is caused by a gradient of the magnetic field;
   correcting an increase of a beam diameter of the electron beam, which is caused by Coulomb-interaction force between the electrons emitted from the emitter; and
   determining if a focusing error is within a range of an allowable error and repeating, when it is determined the focusing error is out of the range of the allowable error, the above operations.

2. The method of claim 1, wherein the setting an initial condition can be realized by setting parameters in the vacuum chamber such that the electrons emitted from the emitter reach the wafer by one time-spiral rotation.

3. The method of claim 2, wherein the parameters in the vacuum chamber satisfy the following equation:

$$V = \frac{qd^2B^2}{2\pi^2 m}\left(1 + \frac{\pi^2 r^2}{d^2}\right)$$

$$v_{o\perp} = r\omega$$

where, V is an acceleration voltage applied to an electrode plate disposed in the vacuum chamber, q is a quantity of an electric charge, d is a distance between the emitter and the wafer, B is an intensity of the magnetic field, r is a rotational radius of the electron rotating in a spiral motion, and m is a mass of the electron.

4. The method of claim 2, wherein the setting an initial condition is realized in a state where it is assumed that the electric and magnetic fields are in parallel with each other, no gradient of the magnetic field is incurred, and no Coulomb-interaction between the electrons in the electron beam exists.

5. The method of claim 1, wherein when $R_{cd}$ is a radius of an area within which the electrons emitted from the identical location in the emitter are projected on the wafer, c is the speed of light, e is a quantity of electric charge, Vo is an initial velocity of the electron, $\alpha$ is an emission angle of the electron, V is an acceleration voltage, m is a mass of the electron, B is an intensity of the magnetic field, and d is a distance between the emitter and the wafer, a condition for minimizing the $R_{cd}$ is calculated from the following equation in the operation of the correcting outspread phenomenon:

$$R_{cd} = 2c\frac{\sqrt{2eV_0 m}}{eB}\sin\alpha\sin\left\{\frac{eBd}{\sqrt{2eVm}}\left[1 - \sqrt{\frac{V_0}{V}}\cos\alpha\right]\right\}$$

wherein, it is assumed that the electric and magnetic fields are in parallel with each other, no gradient of the magnetic field is incurred, and no Coulomb-interaction between the electrons in the electron beam exists.

6. The method of claim 5, wherein the $R_{cd}$ is adjusted to be different from a line width of a pattern, which is to be formed on the wafer, by less than 10%.

7. The method of claim 1, wherein when $\beta$ indicates an angle between electric and magnetic fields, $\Delta$ is a shift distance of the electron beam, d is a distance between the wafer and the emitter, R is a rotational radius of the electron rotating in a spiral motion, e is a quantity of electric charge, B is an intensity of the magnetic field, c is the speed of light, V is an acceleration voltage, and m is a mass of the electron, a condition for minimizing the shift distance $\Delta$ is calculated from the following equations in the operation of the correcting a shift of the electron beam:

$$\Delta = d \sin \beta \text{ and}$$

$$R = \frac{c}{eB}\sqrt{2demV}\sin\beta$$

8. The method of claim 1, wherein the shift distance $\Delta$ is adjusted to be less than 10% of a line width of a pattern, which is to be formed on the wafer.

9. The method of claim 1, wherein the shift distance of the electron beam, which is caused by the gradient of the magnetic field, can be calculated from the following equation:

$$\Delta R_2 = \frac{mv_{0\perp}^2 c}{eB_0^2}\sqrt{\frac{m}{2eV}}\, d\frac{\partial B}{\partial x}$$

where, $\Delta R_2$ is a shift distance of the image when the electron beam reaches the wafer, $V_o^\perp$ is an initial velocity of a component perpendicular to the moving path of the electron, Bo is an intensity of the initial magnetic field at the location of the emitter, d is a distance between the wafer and the emitter, e is a quantity of electric charge, B is an intensity of the magnetic field, c is the speed of light, V is an acceleration voltage, and m is a mass of the electron; and
the shift distance of the electron beam can be minimized by calculating a condition for minimizing the $\Delta R_2$ and applying the calculated condition.

10. The method of claim 9, wherein the shift distance $\Delta R_2$ is adjusted to be less than 10% of a line width of a pattern, which is to be formed on the wafer.

11. The method of claim 1, wherein an increased value of the beam diameter can be calculated form the following equation:

$$\Delta R_1 = \frac{\sqrt{2}\, I}{R_1 V} \sqrt{\frac{m}{eV}}\, d^2$$

where, $\Delta R_1$ indicates the increased value of the beam diameter by the Coulomb-interaction, $R_1$ is a beam diameter of an initial electron beam, I represents emission current of the emitter, d is a distance between the wafer and the emitter, e is a quantity of electric charge, V is an acceleration voltage, and m is a mass of the electron; and the increase of the beam diameter, which is caused by the Coulomb-interaction, can be minimized by calculating a condition for minimizing the increase of the beam diameter form the equation and applying the condition.

12. The method of claim 11, wherein the increased value $\Delta R_1$ is adjusted to be less than 10% of a line width of a pattern, which is to be formed on the wafer.

13. The method of claim 1, wherein the allowable error range is less than 10% of a line width of a pattern, which is to be formed on the wafer.

* * * * *